(12) United States Patent
Murata

(10) Patent No.: US 6,483,184 B2
(45) Date of Patent: *Nov. 19, 2002

(54) SEMICONDUCTOR APPARATUS SUBSTRATE, SEMICONDUCTOR APPARATUS, AND METHOD OF MANUFACTURING THEREOF AND ELECTRONIC APPARATUS

(75) Inventor: Akihiro Murata, Yamanashi-ken (JP)

(73) Assignee: Seiko Epson Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/244,765

(22) Filed: Feb. 5, 1999

(65) Prior Publication Data

US 2001/0030357 A1 Oct. 18, 2001

(30) Foreign Application Priority Data

Feb. 17, 1998 (JP) .......................................... 10-051356

(51) Int. Cl.[7] .............................................. H01L 23/04
(52) U.S. Cl. ........................ 257/698; 257/699; 257/774; 257/784; 257/695; 257/692
(58) Field of Search ................................ 257/738, 695, 257/698, 700, 780, 784, 774, 692, 699, 787

(56) References Cited

U.S. PATENT DOCUMENTS

| 5,508,556 | A | * | 4/1996 | Lin ............................. 257/691 |
| 5,508,886 | A | * | 4/1996 | Lin ............................. 257/691 |
| 5,559,372 | A | * | 9/1996 | Kwon ......................... 438/110 |
| 5,640,047 | A | * | 6/1997 | Nakashima ................. 257/738 |
| 5,920,142 | A | * | 7/1999 | Onishi et al. ........... 310/313 R |
| 5,973,395 | A | * | 10/1999 | Suzuki et al. ............... 257/692 |
| 5,976,912 | A | * | 11/1999 | Fukutomi et al. .......... 438/110 |
| 6,262,513 | B1 | * | 7/2001 | Furukawa et al. ...... 310/313 R |

FOREIGN PATENT DOCUMENTS

JP          A-8-107161        4/1996

* cited by examiner

Primary Examiner—David L. Talbott
Assistant Examiner—Luan Thai
(74) Attorney, Agent, or Firm—Oliff & Berridge, PLC

(57) ABSTRACT

A substrate for a semiconductor apparatus, a semiconductor apparatus and a method of manufacturing thereof and an electronic apparatus are provided that achieve excellent productivity and cost reduction. A semiconductor apparatus is formed from a substrate and a semiconductor device wire-bonded thereto. The substrate includes a substrate main body and pluralities of leads formed on a mounting surface of the substrate on which the semiconductor device is mounted. Conduction sections electrically connected to each of the leads define at least a part of external terminals. The leads have portions located under the semiconductor device, with the remaining portions located outside the semiconductor device depending upon the size of the semiconductor device.

13 Claims, 7 Drawing Sheets

(A)

(B)

(A)

(B)

SEMICONDUCTOR APPARATUS SUBSTRATE, SEMICONDUCTOR APPARATUS, AND METHOD OF MANUFACTURING THEREOF AND ELECTRONIC APPARATUS

BACKGROUND OF THE INVENTION

1. Field of Invention

The present invention relates to a semiconductor apparatus substrate, a semiconductor apparatus, a method of manufacturing thereof and an electronic apparatus.

2. Description of Related Art

Bare-chip mounting methods may be ideal methods to achieve further miniaturization of semiconductor apparatuses. However, because quality control and handling of semiconductor apparatuses made by such methods are difficult, semiconductor apparatuses are provided in the form of packages in order to counter such difficulties. One example of such packages is a BGA (Ball Grid Array) type package in which a semiconductor chip is connected to a substrate having wiring patterns, and external terminals are formed on the wiring patterns. Japanese laid-open patent application HEI 8-107161 describes a package different from the BGA type package for a semiconductor apparatus using a substrate in which external terminals are formed on a peripheral edge area of the substrate.

The semiconductor apparatuses described above need to change wiring patterns depending on the size of semiconductor chips mounted thereon when substrates are formed to have a uniform size. For example, when the size of a substrate is similar to the size of a semiconductor chip, wiring patterns are formed adjacent peripheral areas of the substrate. However, when the size of a semiconductor chip is substantially smaller than the size of a substrate, wiring patterns are drawn in toward a central area of the substrate.

When a relatively small semiconductor chip is mounted on a substrate having wiring patterns formed adjacent the peripheral area of the substrate, longer bonding wires must be used. The wires are often made of gold. As a result, the cost increases, and there is a possibility that the wires are pushed and cut by sealing resin when resin-sealing process is performed.

Consequently, for semiconductor apparatuses using the conventional substrates, the substrates cannot be provided with common wire patterns. Several different wire patterns are required depending on the size of semiconductor chips, and therefore the demand for increased productivity and reduced costs cannot be met.

SUMMARY OF THE INVENTION

The present invention provides solutions to these problems, and it is an object of the present invention to provide a semiconductor apparatus substrate, a semiconductor apparatus and a method of manufacturing thereof and an electronic apparatus that achieve excellent productivity and cost reduction.

In accordance with the present invention, a substrate for a semiconductor apparatus for mounting a semiconductor device thereon to form a semiconductor apparatus comprises a substrate member having a mounting surface for mounting the semiconductor device, a plurality of leads supported by the mounting surface of the substrate member for wire-bonding to the semiconductor device, and a conduction section electrically connected to each of the leads to thereby form at least a part of an external terminal, wherein at least one of the leads has a portion located under the semiconductor device and a remaining portion not located under the semiconductor device depending on the size of the semiconductor device.

In accordance with the present invention, a semiconductor device is positioned over the leads and mounted on the substrate member. As a result, when semiconductor devices having different sizes are mounted on the substrate members, only the length of portions of the leads located below the semiconductor devices differs. Accordingly, substrates having a common size can be used for semiconductor devices of different sizes, and therefore the cost is reduced. Also, the leads located below the semiconductor device are close to the semiconductor device, and accordingly shorter wires can be used, so that the wires are less likely to cut when the wires are sealed in resin.

The conduction section may be formed in a manner that the conduction section extends from a side surface of the substrate member to a surface opposite of the mounting surface for mounting the semiconductor device.

As a result, the conduction section itself can be used as an external terminal.

The substrate member has at least one through-hole formed for each of the leads, and the conduction section is formed on the surface opposite to the mounting surface of the substrate member and may be electrically connected to each of the leads through the through-hole.

As a result, the conduction section is formed on the surface of the substrate member that is not provided with the semiconductor device, and external terminals can be formed on the entire area of this surface, with the result that a face-mount type semiconductor apparatus is manufactured.

Substrate through-holes are formed in the substrate member to communicate with a lead through-hole defined in each of the leads, and each of the leads has at least one wide region for forming the lead through-hole wherein the plurality of leads are disposed such that the wide regions thereof may be positioned in a staggered fashion.

Because the wide regions of the leads are disposed in a staggered fashion, many leads can be disposed with high density.

The plurality of leads extend radially from a peripheral area toward a central area of the substrate member.

Because the leads are radially disposed, many leads can be disposed with high density.

Those of the plurality of leads that extend to corner portions of the semiconductor device to be mounted may protrude toward the central area of the substrate compared to the other of the plurality of leads.

Generally, a semiconductor device has a rectangular external shape, and electrodes are disposed along edges thereof. Therefore, the electrodes at respective corners are separated relatively far from the edges. As a result, the leads are separated most from the electrodes at the respective corners. Also, when the leads are radially disposed, not all of the leads can be extended to the central area of the substrate member.

By using the structure described above, those of the leads disposed at positions corresponding to the corners at which the leads are most separated from the edges are protruded toward the central area farther than other ones of the leads. As a result, the distance between the leads and the electrodes is generally equalized.

The substrate for a semiconductor apparatus is provided with a substrate through-hole for each of the leads, and the substrate through-hole communicates with the lead through-hole defined in each of the leads in the peripheral area of the substrate member.

The leads need to have a greater width to provide a lead through-hole in the lead. When the leads are radially disposed, the width of the leads can be made greater in the peripheral areas of the substrate member. Therefore, lead through-holes may be provided in the leads adjacent to the peripheral areas of the substrate member. As a result, the leads are disposed with high density without a hindrance.

A semiconductor apparatus in accordance with the present invention includes a semiconductor device having a plurality of electrodes and a substrate defining a mounting surface for mounting the semiconductor device. The substrate has a plurality of leads supported by the mounting surface, and a conduction section electrically connected to each of the leads to thereby form at least a part of an external terminal. The semiconductor device is mounted on a lead-forming surface of the substrate on which the leads are formed. At least one of the leads has a portion located under the semiconductor device and the remaining portion not located under the semiconductor device, and the electrodes of the semiconductor device are wire-bonded to the respective leads.

In accordance with the present invention, a semiconductor device is positioned above the leads and mounted on the substrate. As a result, when semiconductor devices having different sizes are used, only the length of portions of the leads located below the semiconductor devices differs. Accordingly, substrates having a common size can be used without regard to the size of semiconductor devices. As a result, the cost is reduced.

Also, the leads located below the semiconductor device are positioned close to the semiconductor device and therefore shorter wires can be used, so that the wires are less likely to be cut when the wires are sealed in resin.

The semiconductor device may be mounted on the substrate on a surface opposite to the surface having the electrodes formed thereon. Each of the electrodes of the semiconductor device is connected to each of the leads by a wire, and the at least one lead having one portion located under the semiconductor device is connected to the wire at a location not under the semiconductor device.

As a result, when semiconductor devices having different sizes are used, only wire bonding positions with respect to the leads change, and therefore, substrates having a common size can be used without regard to the size of semiconductor devices.

An insulation member may be provided between the semiconductor device and the substrate.

The insulation member provides insulation between the leads and the semiconductor chip.

Any one of the semiconductor apparatus substrates described above may be used as the substrate.

The conduction section is formed on a surface opposite of the lead-forming surface of the substrate. The substrate includes a substrate through-hole for each of the conduction sections, each of the conduction sections electrically connected to each of the leads through the through-hole. A plurality of the conduction sections are disposed at predetermined pitches, and the external terminals are formed only on at least every other conduction section.

As a result, the pitch of the external terminals are changes.

A method for manufacturing a semiconductor apparatus in accordance with the present invention includes:

preparing a substrate having a plurality of leads supported by one surface thereof and a conduction section electrically connected to each of the leads to thereby form at least a part of an external terminal;

mounting a semiconductor device on a part of at least one of the leads to thereby attach the semiconductor device to the substrate; and wire-bonding electrodes of the semiconductor device to the leads.

In accordance with the present invention, a semiconductor device is positioned above the leads and mounted on the substrate. As a result, when semiconductor devices having different sizes are used, only the length of portions of the leads located below the semiconductor device changes. Accordingly, substrates having a common size can be used without regard to the size of semiconductor devices. As a result, the cost is reduced.

In this method, the semiconductor device is mounted on an opposite surface of the substrate opposite to the surface having the electrodes. The electrodes of the semiconductor device are connected to leads by wires. The leads have portions located under the semiconductor device that are connected to the electrodes by the wires at locations not under the semiconductor device.

As a result, when semiconductor devices having different sizes are used, only wire bonding positions with respect to the leads change, and therefore, substrates having a common size can be used without regard to the size of semiconductor devices.

An electronic apparatus in accordance with the present invention has a circuit substrate provided with the semiconductor apparatus manufactured according to one of the methods described above.

DETAILED DESCRIPTION OF PREFERRED EMBODIMENTS

Embodiments of the present invention will be described below with reference to the accompanying drawings.

Figure 1:
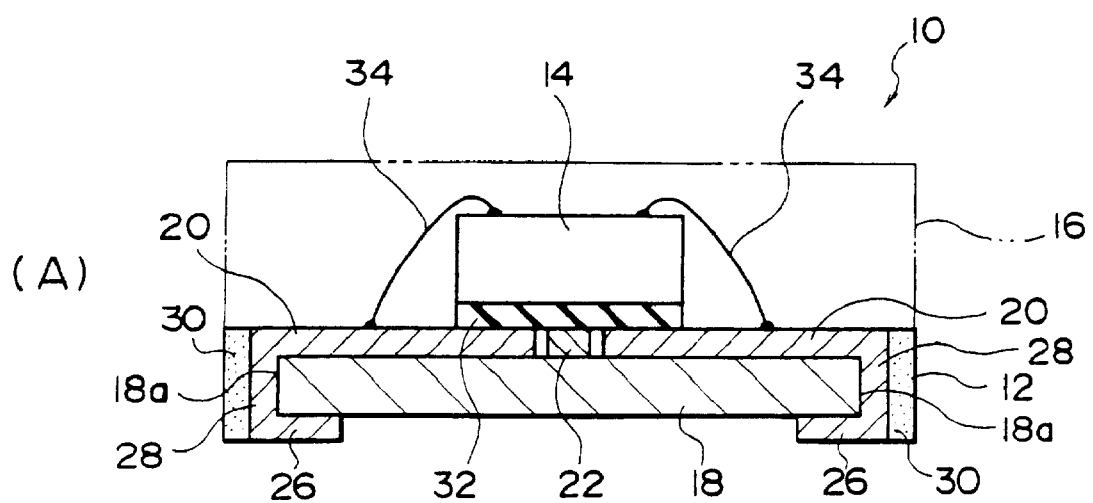
FIGS. 1(A) and 1(B) show a semiconductor apparatus in accordance with a first embodiment of the present invention.
Figure 1:
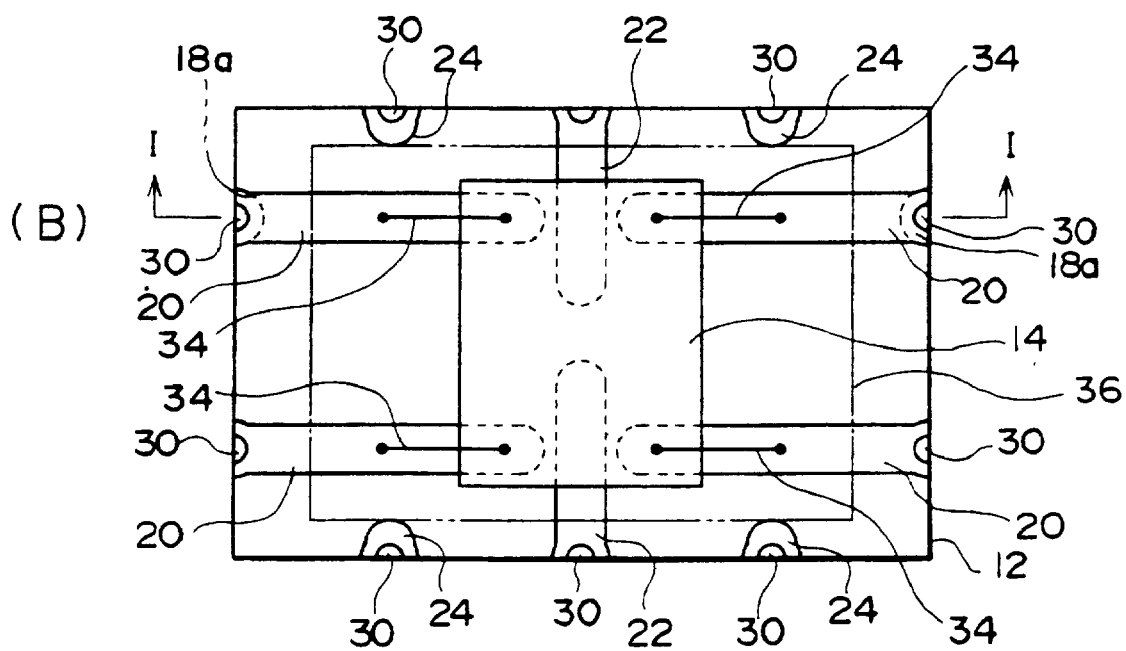

FIGS. 1(A) and 1(B) show a semiconductor apparatus in accordance with a first embodiment of the present invention. FIG. 1(B) is a plan view, and FIG. 1(A) is a cross-sectional view taken along lines I—I of FIG. 1(B).

In the figures, a semiconductor apparatus 10 includes a substrate 12 and a semiconductor device 14 (semiconductor chip =IC chip) that are sealed by molding resin 16. It is noted that the molding resin 16 is shown in two-dot-and-dash lines in FIG. 1(A), and omitted in FIG. 1(B).

The substrate for a semiconductor apparatus (simply referred to as the substrate) 12 includes a rectangular substrate main body 18. A plurality of leads 20, 22, 24 are formed on one surface of the substrate main body 18, and a plurality of conduction sections 26 are formed on another surface opposite to the one surface of the substrate main body 18. For example, the substrate 12 is formed from (1) a metal substrate having a core defined by the substrate main body 18 that is relatively hard and has a relatively high coefficient of thermal conductivity, such as, for example, copper, aluminum, and the like, (2) a glass epoxy substrate (i.e., printed circuit board), and (3) a flexible substrate that is made from relatively soft and flexible material, such as, for example, polyimide or the like. The same substrate is applicable to other embodiments.

In a preferred embodiment of the present invention, a metal substrate is used. A metal substrate is manufactured by the following method. First, insulation films of resin, glass epoxy or the like are provided on both surfaces of a base member of copper, aluminum or the like. Conductive wires are formed on both of the insulation films. Apertures are formed in the base member in advance, the apertures are filled with the material of the insulation film, and through-holes of smaller diameter are formed in the center of the apertures. Conductive members are provided in the through-holes. The wiring patterns on the front and the rear surfaces are electrically connected to one another through the conductive members. As a result, this method provides a metal substrate with both of its surfaces electrically connected.

The leads 20 extend from a pair of parallel side edges of the substrate main body 18 toward areas adjacent to the central area of the substrate main body 18. One pair of the leads 20 extends from the side edges toward the opposite side edges to such an extent that a gap is formed between the pair of the leads 20 adjacent the central area. The leads 22 extend from another pair of parallel side edges of the substrate main body 18 in a manner that the leads 22 pass through the gap between the pair of the leads 20. The leads 24 are formed at positions that do not interfere with the leads 20 and 22.

The leads 20, 22, 24 have wider areas at the side edges of the substrate main body 18. Semi-circular cuts 18a are formed in the side edges of the substrate main body 18 at locations corresponding to the wider areas. Conductive layers 28 are formed on the surfaces of the cuts 1 8a, and conduction sections 26 are provided at location corresponding to the respective conductive layers 28. The conduction sections 26 and the conductive layers 28 are continuously formed, so that they can be generally defined as conduction sections. The leads 20, 22 and 24 are electrically connected to the conductive layers 28 and the conduction sections 26, respectively. Solder sections 30 are provided on the conductive layers 28. The conductive layers 28, the conduction sections 26 and the solder sections 30 form external terminals. The solder sections 30, if provided on the side of a mounting substrate, can be omitted.

The semiconductor device 14 is adhered through an insulation layer 32 to a surface of the substrate main body 18 on which the leads 20, 22 and 24 are formed. In another embodiment, insulation adhesive may be used instead of the insulation layer 32.

The semiconductor device 14 is positioned above portions of the leads 20 and 22, as shown in FIG. 1(B). In other words, portions of the leads 20 and 22 are located below the semiconductor device 14, and the remaining portions are located outside the semiconductor device 14. Because the semiconductor device 14 is mounted on the leads 20 and 22, the insulation layer 32 is disposed between them to provide electrical insulation.

The semiconductor device 14 is electrically connected through wires 34 to the leads 20 at areas outside the semiconductor device 14. More specifically, the semiconductor device 14 defines a mounting surface to be mounted on the substrate main body 18 and includes electrodes (not shown) provided on its surface opposite of the mounting surface. The electrodes and the leads 20 are connected by the wires 34. In accordance with the present invention, the leads 22 and 24 are not connected to the wires 34. However, depending on the number of the electrodes of the semiconductor device 14, the electrodes and the leads 22 and 24 may be connected to one another.

The molding resin 16 covers the semiconductor device 14, the wires 34, and the mounting surface of the substrate main body 18 that mounts the semiconductor device 14.

In accordance with the present invention, the semiconductor device 14 is placed on the leads 20 and 22, and is connected to the leads 20 and 22 in areas outside the semiconductor device 14. As a result, portions of the leads 20 and 22 that are located under the semiconductor device 14 and portions of the leads 20 and 22 that are located outside the semiconductor device 14 may be at any length ratios, and they do not present any particular problems unless they interfere with the wire bonding by the wires 34. Therefore, as shown in FIG. 1(B) using a two-dot chain line, a semiconductor device 36 that has a size different from the semiconductor device 14 can be used. In this case, the only difference is that the length of the leads 20 and 22 located under the semiconductor device 36 is different from the length thereof located under the semiconductor device 14. Also, a semiconductor device having a size that extends over the leads 24 can be mounted.

As a result, in accordance with the present invention, the substrate 12 can accommodate and therefore can be commonly used for semiconductor devices of a variety of different sizes. This feature results in reducing the costs. Further, since the leads 20 located below the semiconductor device 14 are close to the semiconductor device 14, the wires 34 can be shortened to the minimum. As a result, the probability that the wires 34 are cut is reduced when molding resin 16 seals the wires.

Figure 2:
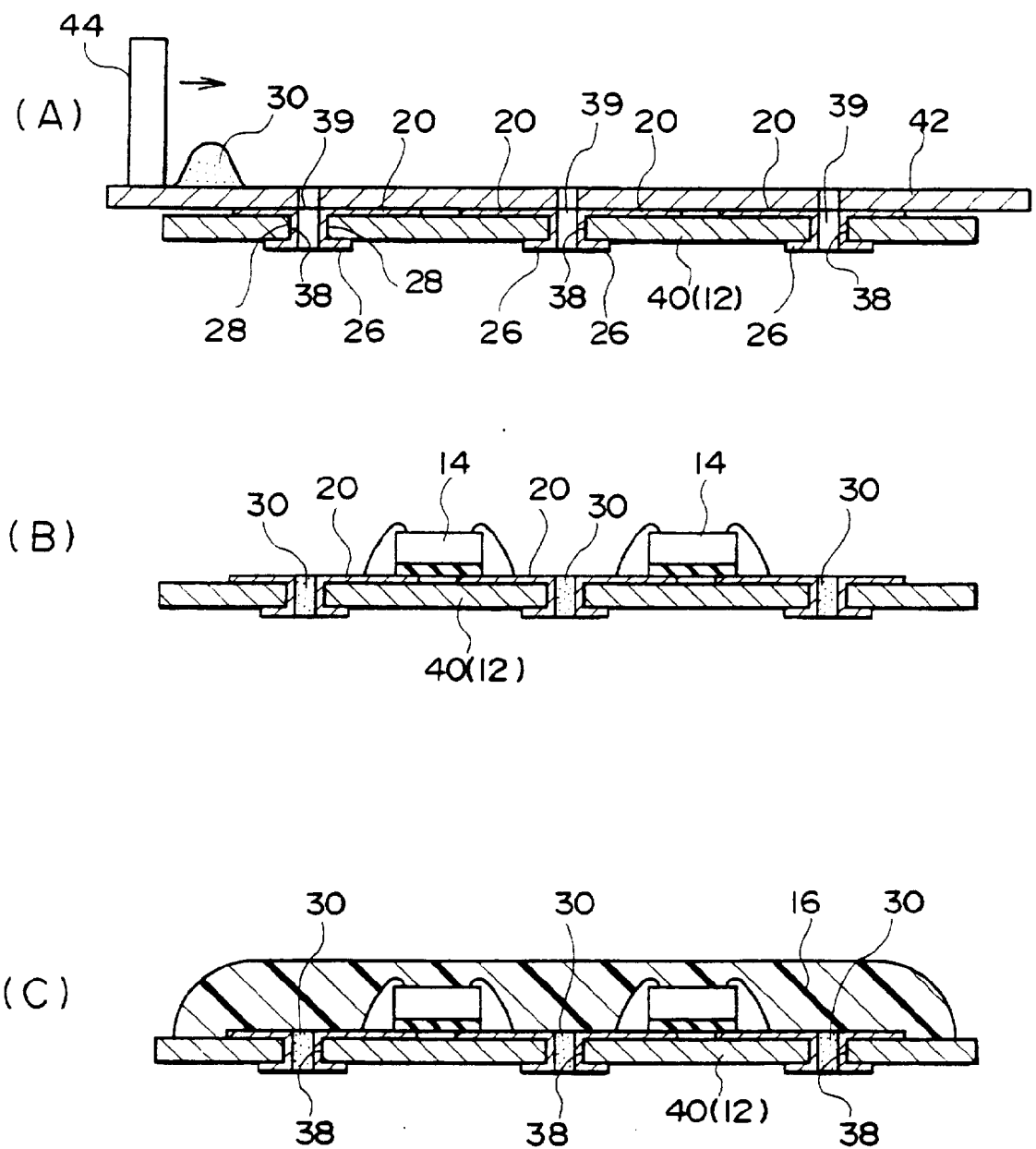
FIGS. 2(A)–2(C) illustrate a method of manufacturing a semiconductor apparatus in accordance with the first embodiment.

FIGS. 2(A)–2(C) illustrate a method of manufacturing a semiconductor apparatus in accordance with one embodiment of the present invention. As shown in FIG. 2(A), a stencil 42 is placed on a substrate 40.

The substrate 40 is provided with pluralities of substrate through-holes 38, and leads 20, 22 and 24 and conduction sections 26 shown in FIG. 1(B) are formed with each of the substrate through-holes 38 as a starting point. Conductive layers 28 are formed on internal surfaces of the through-holes 38. According to this structure, lead through-holes 39 are defined by the surfaces of the conduction layers 28. The leads 20, 22 and 24 have wider areas as shown in FIG. 1(B) so that the leads are not cut even when the lead through-holes 39 are formed.

The substrate 40 is cut to provide the substrates 12 shown in FIG. 1(A) in a step performed later. Also, the through-holes 38 are cut in a step performed later to define the cuts 18a of the substrate main body 18 of the substrate 12 shown in FIG. 1(A).

Then, solder 30 in the form of paste is placed on the stencil 42, a squeeze 44 is moved to fill the solder 30 into the lead through-holes 39.

Next, as shown in FIG. 2(B), pluralities of semiconductor devices 14 are attached to the substrate 40 and wire bonding is performed for electrical connection.

Then, as shown in FIG. 2(C), resin-sealing step is performed with the molding resin 16. The resulting structure is shown in detail in FIG. 1(A). As the substrate 40 is cut at locations of the substrate through-holes 38 (through-holes 39), pluralities of the semiconductor apparatuses 10 are manufactured at the same time.

The manufacturing method is described in detail in Japanese laid-open patent application HEI 8-107161. Accordingly, further description of the method is omitted. In an alternative embodiment, the substrates 12 may be cuts first, and remaining steps after the step of mounting the semiconductor devices 14 thereon may be performed.

Figure 3:
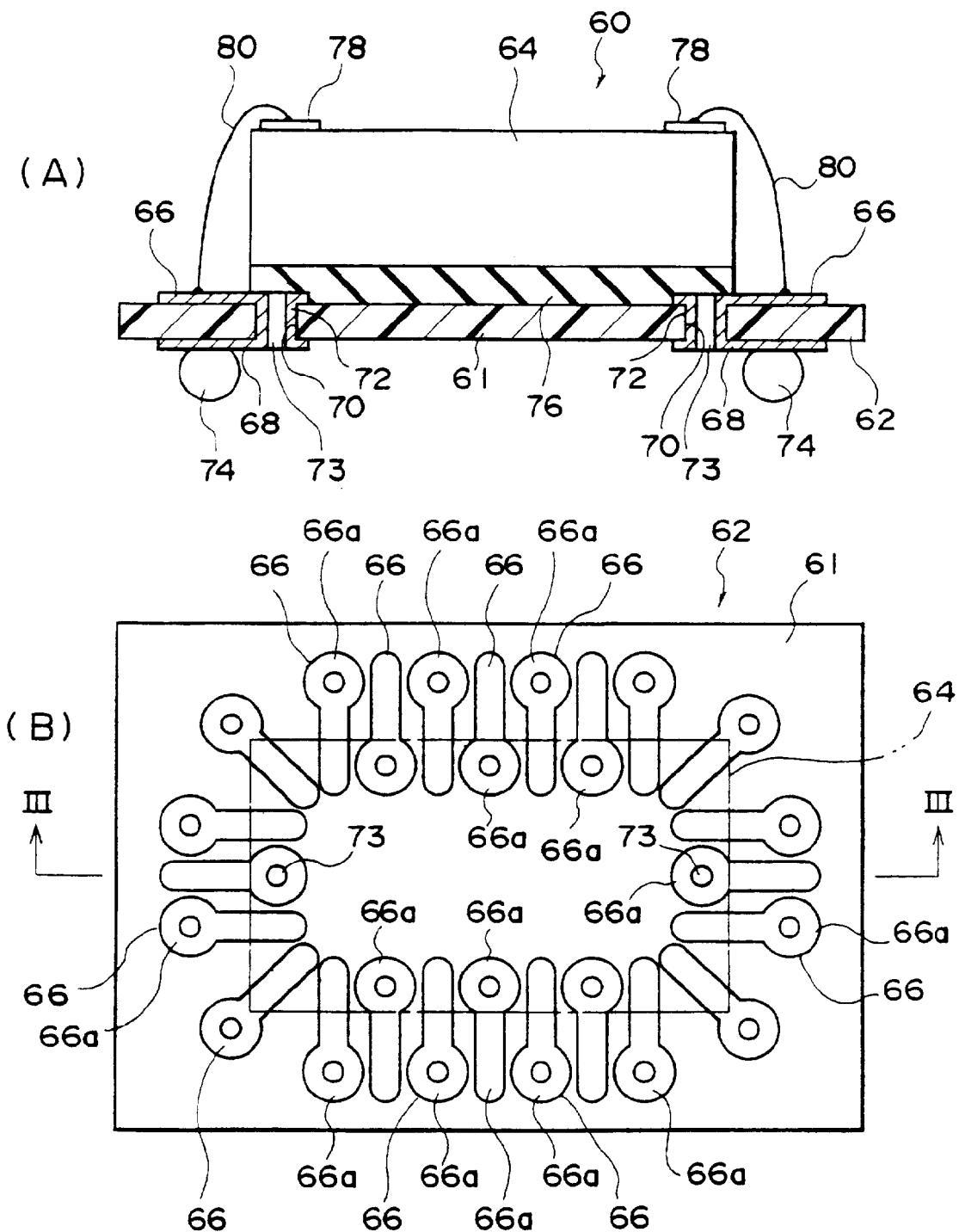
FIG. 3(A) shows a semiconductor apparatus in accordance with a second embodiment of the present invention.
FIG. 3(B) shows a substrate used for the semiconductor apparatus.

FIG. 3(A) shows a semiconductor apparatus in accordance with a second embodiment of the present invention, and FIG. 3(B) shows a substrate used for the semiconductor apparatus. FIG. 3(A) is a cross-sectional view taken along lines III B III of FIG. 3(B).

FIG. 3(A) shows a semiconductor apparatus 60 in a BGA type package, in which a semiconductor device 64 is attached to a substrate 62.

The substrate 62 has pluralities of leads 66 on one surface of a substrate main body 61. The substrate 62 is made of any material, such as, for example, metal, resin, ceramics and the like. Conduction sections 68 are formed on the other surface of the substrate main body 61 at locations corresponding to the respective leads 66. The leads 66 and the conduction sections 68 are electrically connected to one another through conduction layers 72 within internal surfaces of the substrate through-holes 70 formed in the substrate main body 61. The substrate through-holes 70 must have a relatively large diameter to make the conduction layers 72 to be relatively large. For this reason, each of the leads 66 is provided with a wide area 66a, as shown in FIG. 3(B).

Lead through-holes 73 formed on the surfaces of the conduction layers 72 pass through the respective leads 66.

Solder balls 74 are provided at the conduction sections 68, so that the conduction sections 68 and the solder balls 74 form external terminals.

The substrate main body 61 has a lead-forming surface for the leads 66, and a semiconductor device 64 is attached to the lead-forming surface through an insulation adhesive layer 76. Also, as shown by a two-dot-and-dash line in FIG. 3(B), portions of the respective leads 66 are located beneath the semiconductor device 64. It is noted that the size of the portions of the leads 66 that are located beneath the semiconductor device 64 is not limited to the one illustrated in the figures, and therefore, semiconductor devices of various sizes can be used. Also, it is not necessary that portions of all the leads 66 should be located beneath the semiconductor device 64. A portion of at least one of the leads 66 may be located below the semiconductor device 64 depending on the size and/or the shape of the semiconductor device 64.

Wires 80 electrically connect pluralities of electrodes 78 of the semiconductor device 64 and the corresponding wires 66 to one another.

The present embodiment is characterized by the configuration of the leads 66. As described above, the leads 66 have the wide areas 66a. The wide areas 66a of adjacent ones of the leads 66 are disposed in a staggered manner. As a result, the leads 66 can be concentrated in one area, and therefore the substrate 62 can be made smaller.

In accordance with the present embodiment, the substrate 62 can accommodate and thus can be commonly used for semiconductor devices of various sizes. This feature results in reducing the costs. Further, since the leads 66 located beneath the semiconductor device 64 are close to the semiconductor device 64, the wires 80 can be shortened to the minimum. As a result, the probability of cutting the wires 80 is reduced when the molding resin 16 seals them.

The present embodiment is applicable to the BGA type package, Chip Size/Scale Package, and the like.

Figure 4:
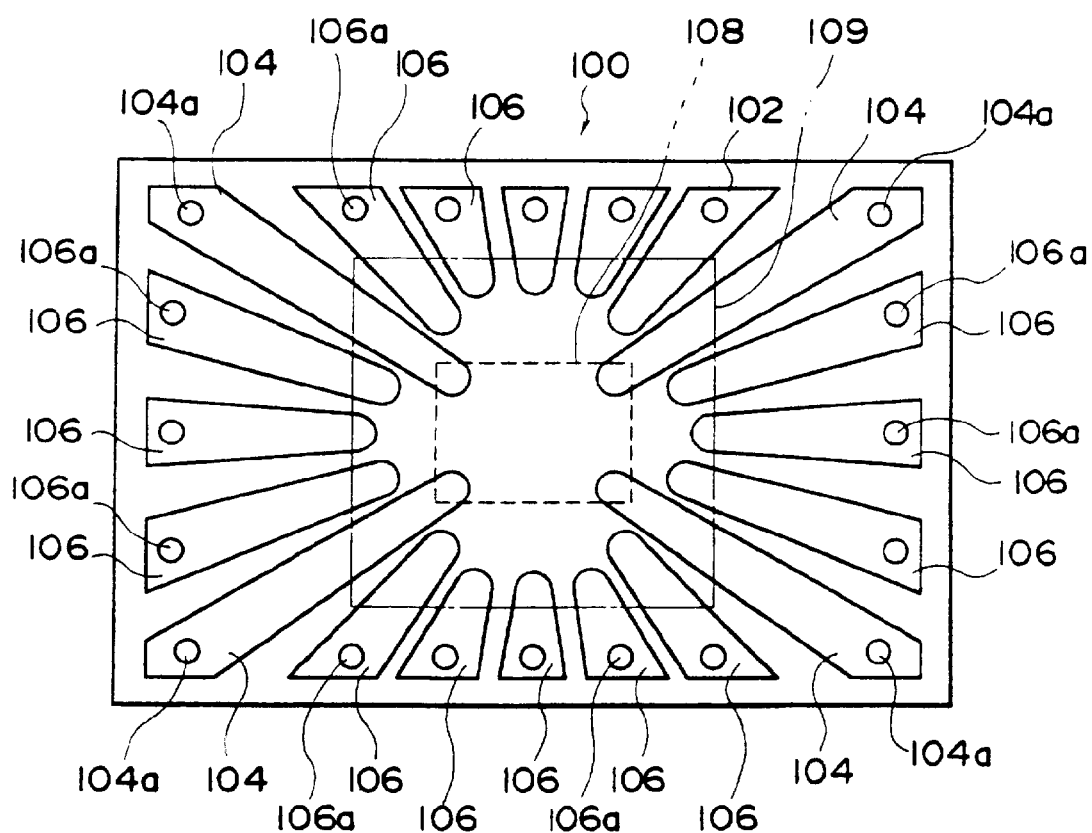
FIG. 4 shows a substrate for a semiconductor apparatus in accordance with a third embodiment of the present invention.

FIG. 4 shows a substrate for a semiconductor apparatus in accordance with a third embodiment of the present invention. In the figure, a substrate 100 is formed from a substrate main body 102 and pluralities of leads 104 and 106 formed on the substrate main body 102. The leads 104 and 106 radially extend from a peripheral area to a central area of the substrate main body 102. It is noted that the leads 104 and 106 end before the central area of the substrate main body 102, so that the leads are not formed in the central area of the substrate main body 102.

The leads 104 and 106 are formed with lead through-holes 104a and 106a in a manner similar to that of the lead through-holes 73 formed in the leads 66 shown in FIG. 3(B). Conduction sections (not shown) conducting to the respective leads 104 and 106 are formed on a rear surface of the substrate main body 102, in a similar manner as the conduction sections 68 shown in FIG. 3(A). The leads 104 and 106 are radially disposed, so that the leads 104 and 106 can be made wider in the peripheral area than the central area. Accordingly, lead the through-holes 104a and 106a are formed adjacent to the peripheral area.

The leads 104 extend toward the central area from areas adjacent to four corners of the substrate main body 102. The leads 106 are formed to extend from areas adjacent to four edges of the substrate main body 102. It is noted that the leads 104 among all the leads are disposed most adjacent to (or disposed on) diagonal lines of the substrate main body 102.

In this embodiment, the leads 104 protrude more toward the central area of the substrate main body 102 than the other leads 106. As the leads 104 and 106 are formed in a radially extending fashion, they are densely disposed in the central area. Therefore, when the leads have a predetermined width, only a few of the leads can be extended longer than the other leads. Therefore, in accordance with the present embodiment, the leads 104 located most adjacently to (or located on) the diagonal lines of the substrate main body 102 are selectively made to be longer than the other leads. The leads 104 extend toward corners of the semiconductor device 108 that is mounted on the substrate 100, and leading ends of the leads 104 reach areas below the semiconductor device 108.

As a result, the leads 104 are disposed close to the corners of the semiconductor device 108. In general, electrodes of the semiconductor device are disposed in inward areas removed from the corners. In accordance with the present embodiment, the leads 104 can be disposed close to the corners, and therefore the length of bonding wires passing adjacent the corners can be made shorter. As a consequence, the length of bonding wires passing along the edges and the corners of the semiconductor device 108 is made uniform. This reduces the force that may be applied to the bonding wires by resin during a resin-sealing step to be performed later, and prevents poor molding.

In accordance with the present embodiment, the substrate 100 can mount a semiconductor device 109 having a size and shape different than those of the semiconductor device 108. Therefore, the substrate 100 is capable for common use.

Figure 5:
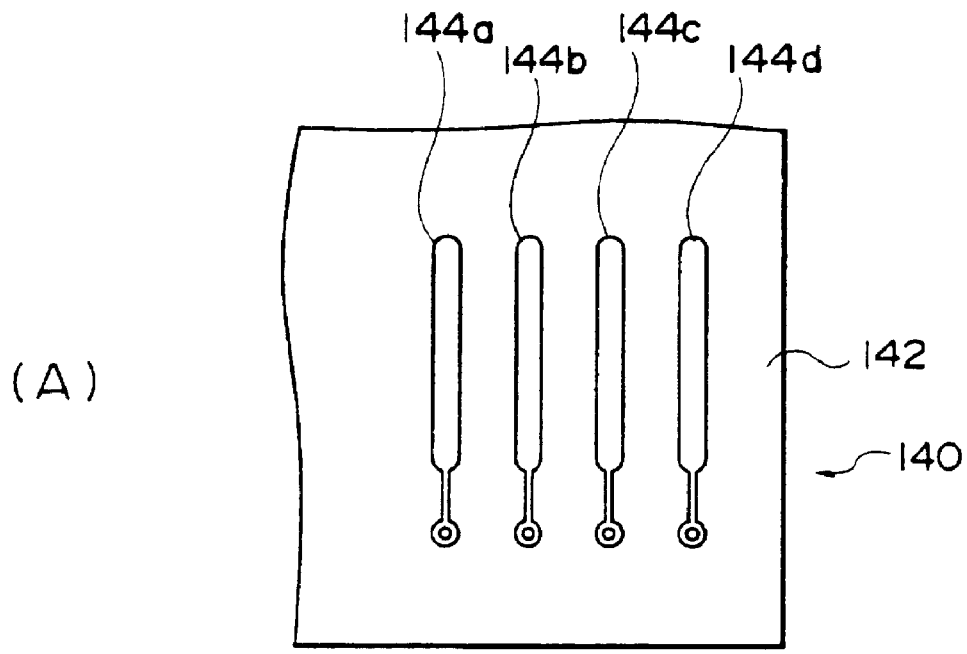
FIGS. 5(A) and 5(B) show a substrate for a semiconductor apparatus in accordance with a fourth embodiment of the present invention, more particularly, show one surface of the substrate and the other surface thereof, respectively.
Figure 5:
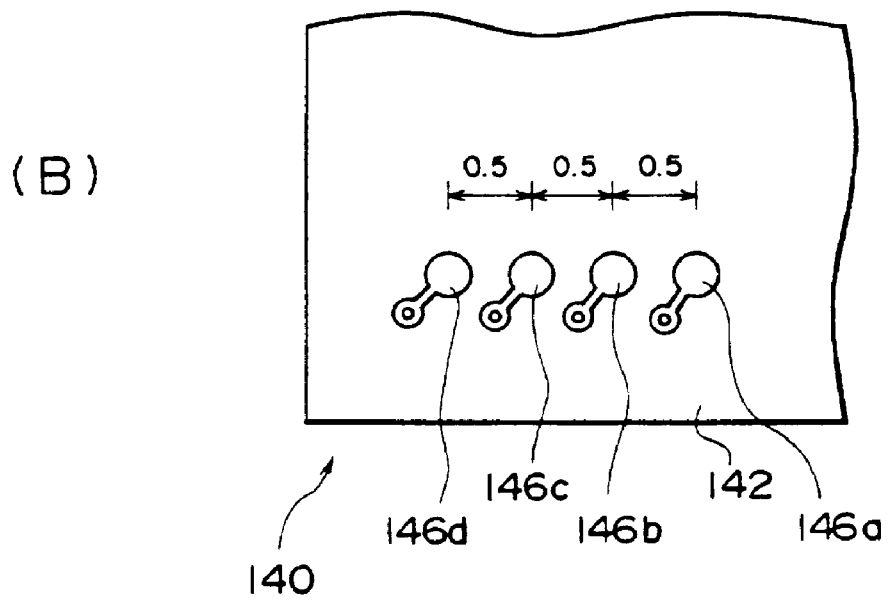

FIGS. 5(A) and 5(B) show a substrate for a semiconductor apparatus in accordance with a fourth embodiment of the present invention. The figures show one surface and the other surface of the substrate, respectively. This embodiment is further applicable to the embodiments described above.

A substrate 140 has pluralities of (four) leads 144a–144d on the one surface of a substrate main body 142, as shown in FIG. 5(A), and pluralities of (four) conduction sections 146a–146d on the other surface, as shown in FIG. 5(B). The leads 144a–144d and the conduction sections 146a–146d form pairs, respectively, and are electrically connected to one another through substrate through-holes (not shown) formed in the substrate main body 142. The conduction sections 146 are formed at pitches of 0.5mm, for example.

In accordance with the present invention, all of the leads 144a–144d can be connected to electrodes of a semiconductor device, and all of the conduction sections 146a–146d can be provided with solder balls. Also, solder balls can be provided at every other conduction section.

For example, in FIG. 5(A), the leads 144a and 144c are connected to electrodes of a semiconductor device, and solder balls can be provided at the corresponding conduction sections 146a and 146c, respectively.

When solder balls are provided at all of the conduction sections 146a–146d, external terminals can be formed at pitches of 0.5mm. When solder balls are provided at the conduction sections 146a and 146c, external terminals at pitches of 1.0mm can be formed.

Accordingly, the substrate 140 can be commonly used for external terminals of different pitches.

When more leads and conduction sections are formed, every other or more of them can be used, and the pitch can be made greater.

By application of the present embodiment to the other embodiments described above, the probability of cutting wires is lowered and the pitch of external terminals can be readily changed.

Figure 6:
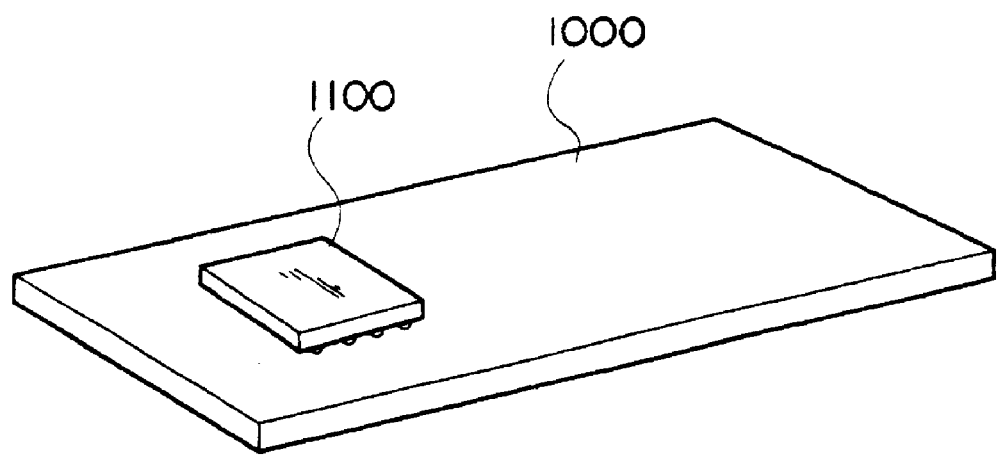
FIG. 6 shows a circuit substrate having a semiconductor apparatus mounted thereon in accordance with the present invention.

FIG. 6 shows a circuit substrate 1000 having a semiconductor apparatus 1100 of the present invention mounted thereon. Generally, an organic substrate, such as, for example, a glass epoxy substrate or the like is used for the circuit substrate. Wire patterns defining a specified circuit formed from copper or the like are provided on the circuit substrate, and the wire patterns and bumps of a semiconductor apparatus are mechanically connected to one another to achieve electrical conduction.

Figure 7:
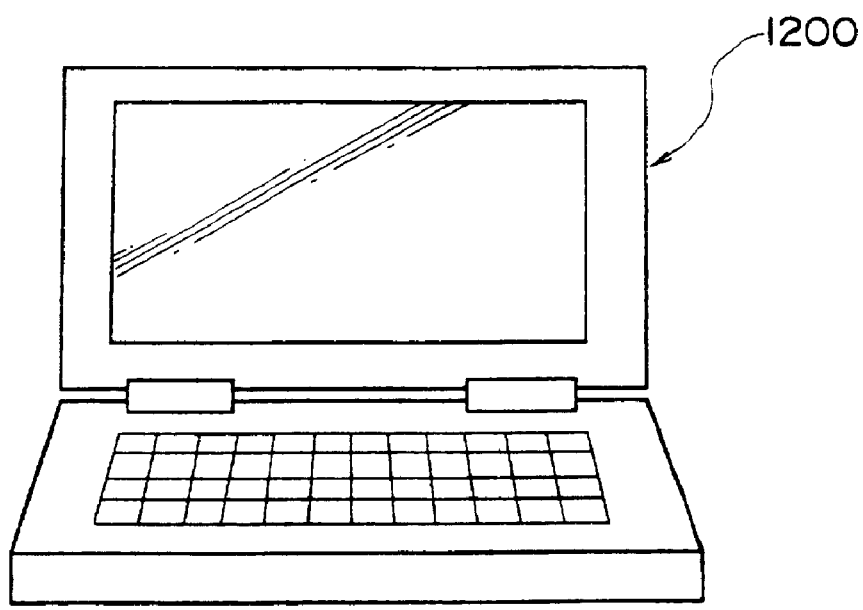
FIG. 7 shows an electronic apparatus in accordance with the present invention.

FIG. 7 shows a notebook type personal computer 1200 as an example of an electronic apparatus having the circuit substrate 1000.

The present invention is applicable to manufacturing electronic devices (both active devices and passive devices) for the surface mounting that requires numerous bumps, like semiconductor apparatuses. The electronic parts include, for example, resistors, capacitors, coils, oscillators, filters, temperature sensors, thermistors, varistors, volumes, fuses and the like.

What is claimed is:

1. A semiconductor apparatus substrate for mounting a semiconductor device thereon to form a semiconductor apparatus, comprising:

a substrate member having a mounting surface for mounting the semiconductor device and an opposite surface opposite to the mounting surface;

a plurality of leads supported by the mounting surface of the substrate member for wire-bonding to the semiconductor device and extending from side edges of the substrate member so that at least one lead extending from a side edge passes through a gap between a pair of other leads extending from different side edges;

a conduction section disposed on said opposite surface, the conduction section being disposed so as not to extend directly beneath the semiconductor device, and being electrically connected to each of the leads at the side edges of the substrate to thereby form at least a part of an external terminal, at least one of the leads being elongated and having a portion located on said mounting surface under the semiconductor device and a remaining portion located on said mounting surface not under the semiconductor device depending on the size of the semiconductor device.

2. The semiconductor apparatus substrate according to claim 1, the conduction section extending between a side surface of the substrate member and an opposite surface opposite to the mounting surface of the substrate member.

3. The semiconductor apparatus substrate according to claim 1, further comprising at least one substrate through-hole formed in the substrate member for each of the leads, the conduction section being formed on the opposite surface of the substrate member and being electrically connected to each of the leads through the substrate through-holes.

4. The semiconductor apparatus substrate according to claim 3, the at least one substrate through-hole communicating with a lead through-hole defined in each of the leads, and each of the leads having at least one wide region for forming the lead through-hole and the plurality of leads being disposed such that the wide regions thereof are positioned in a staggered fashion.

5. The semiconductor apparatus substrate according to claim 3, wherein the plurality of leads extend radially from a peripheral area toward a central area of the substrate member.

6. The semiconductor apparatus substrate according to claim 5, ones of the plurality of leads extending to corner portions of the semiconductor-device to be mounted extending farther toward the central area of the substrate than others of the plurality of leads.

7. The semiconductor apparatus substrate according to claim 5, one of the through-holes being provided for each of the leads, and the substrate through-holes being formed in the peripheral area of the substrate member.

8. A semiconductor apparatus comprising:

a semiconductor device having a plurality of electrodes and a substrate having a mounting surface for mounting the semiconductor device and an opposite surface opposite to the mounting surface, the substrate having a plurality of leads supported by the mounting surface, the plurality of leads extending from side edges of the substrate so that at least one lead extending from a side edge passes through a gap between a pair of other leads extending from different side edges and a conduction section disposed on said opposite surface, the conduction section being disposed so as not to extend directly beneath the semiconductor device, and being electrically connected at the side edges of the substrate to each of the leads to thereby form at least a part of an external terminal, the semiconductor device being mounted on the mounting surface of the substrate on which the plurality of leads are formed, at least one of the leads being elongated and having a portion located on said mounting surface under the semiconductor device and a remaining portion located on said mounting surface not under the semiconductor device, and the electrodes of the semiconductor device being wire-bonded to the respective leads.

9. The semiconductor apparatus according to claim 8, wherein each of the electrodes of the semiconductor device being connected to each of the leads by a wire, and the at least one lead having one portion located under the semiconductor device being connected to the wire outside of the semiconductor device.

10. The semiconductor apparatus according to claim 8, further comprising an insulation member provided between the semiconductor device and the substrate.

11. The semiconductor apparatus according to claim 8, the conduction section being formed on an opposite surface opposite to the mounting surface of the substrate, the substrate including a substrate through-hole for each of the conduction sections, each of the conduction sections being electrically connected to each of the leads through the substrate through-hole, a plurality of the conduction sections being disposed at predetermined pitches, and the external terminals being formed only on at least every other conduction section.

12. An electronic apparatus having a circuit substrate provided with the semiconductor apparatus claim 8.

13. An electric apparatus having a semiconductor apparatus comprising:

a semiconductor device having a plurality of electrodes and a substrate having a mounting surface for mounting the semiconductor device and an opposite surface opposite to the mounting surface, the substrate having a plurality of leads supported by the mounting surface, the plurality of leads extending from side edges of the substrate so that at least one lead extending from a side edge passes through a gap between a pair of other leads extending from different side edges and a conduction section disposed on said opposite surface, the conduction section being disposed so as not to extend directly beneath the semiconductor device, and being electrically connected to each of the leads at the side edges of the substrate to thereby form at least a part of an external terminal;

the semiconductor device being mounted on the mounting surface of the substrate on which the plurality of leads are formed;

at least one of the leads being elongated and having a portion located on said mounting surface under the semiconductor device and a remaining portion located on said mounting surface not under the semiconductor device; and the electrodes of the semiconductor device being wire-bonded to the respective leads.

* * * * *